US011169013B2

(12) United States Patent
Rensing et al.

(10) Patent No.: US 11,169,013 B2
(45) Date of Patent: Nov. 9, 2021

(54) FREQUENCY SPACINGS TO PREVENT INTERMODULATION DISTORTION SIGNAL INTERFERENCE

(71) Applicant: Micro Motion, Inc., Boulder, CO (US)

(72) Inventors: Matthew Joseph Rensing, Cincinnati, OH (US); Timothy J. Cunningham, Boulder, CO (US)

(73) Assignee: Micro Motion, Inc., Boulder, CO (US)

( * ) Notice: Subject to any disclaimer, the term of this patent is extended or adjusted under 35 U.S.C. 154(b) by 117 days.

(21) Appl. No.: 16/616,199

(22) PCT Filed: Jun. 14, 2017

(86) PCT No.: PCT/US2017/037530
§ 371 (c)(1),
(2) Date: Nov. 22, 2019

(87) PCT Pub. No.: WO2018/231229
PCT Pub. Date: Dec. 20, 2018

(65) Prior Publication Data
US 2020/0109980 A1    Apr. 9, 2020

(51) Int. Cl.
*G01R 23/20* (2006.01)
*G01F 1/84* (2006.01)
(Continued)

(52) U.S. Cl.
CPC ........ *G01F 1/8436* (2013.01); *G01F 25/0007* (2013.01); *G01R 23/00* (2013.01);
(Continued)

(58) Field of Classification Search
CPC ........ G01R 23/20; G01R 23/16; G01R 27/32; G01R 27/28; G01R 29/06; G01R 29/26;
(Continued)

(56) References Cited

U.S. PATENT DOCUMENTS

| 5,907,104 A | 5/1999 | Cage et al. |
| 2014/0161159 A1* | 6/2014 | Black ................... H04B 1/0475 375/219 |

(Continued)

FOREIGN PATENT DOCUMENTS

| WO | 2017019012 A1 | 2/2017 |
| WO | 2017069749 A1 | 4/2017 |

OTHER PUBLICATIONS

Matthew Rensing et al.: "Coriolis Flowmeter Verification via Embedded Modal Analysis" In "MEMS and Nanotechnology, vol. 4", Jan. 2, 2011, Springer New York, New York, NY, XP055132407, ISSN: 2191-5644; ISBN: 978-1-46-140210-7, pp. 851-860, DOI: 10.1007/978-1-4419-9834-7_75.

*Primary Examiner* — Raul J Rios Russo
(74) *Attorney, Agent, or Firm* — The Ollila Law Group LLC (57) ABSTRACT

A system (800) for determining frequency spacings to prevent intermodulation distortion signal interference is provided. The system (800) includes a sensor assembly (810) and a meter verification module (820) communicatively coupled to the sensor assembly (810). The meter verification module (820) is configured to determine a frequency of a first signal to be applied to a sensor assembly (810) of a vibratory meter and set a demodulation window about the frequency of the first signal. The meter verification module (800) is also configured to determine a frequency of the second signal to be applied to the sensor assembly such that a frequency of an intermodulation distortion signal generated by the first signal and the second signal is outside the demodulation window.

22 Claims, 8 Drawing Sheets

(51) Int. Cl.
*G01F 25/00* (2006.01)
*G01R 23/00* (2006.01)
*G01R 27/32* (2006.01)
*G01R 23/16* (2006.01)
*G01R 27/28* (2006.01)
*G01R 29/06* (2006.01)
*G01R 29/26* (2006.01)
*H04B 3/46* (2015.01)
*H04B 17/20* (2015.01)

(52) U.S. Cl.
CPC ............. *G01R 23/16* (2013.01); *G01R 23/20* (2013.01); *G01R 27/28* (2013.01); *G01R 27/32* (2013.01); *G01R 29/06* (2013.01); *G01R 29/26* (2013.01); *H04B 3/46* (2013.01); *H04B 17/20* (2015.01)

(58) Field of Classification Search
CPC .......... G01R 23/00; H04B 3/46; H04B 17/20; G01F 1/8436; G01F 25/0007; G01F 1/84
USPC ... 324/76.11–76.83, 459, 600, 612, 620, 624
See application file for complete search history.

(56) References Cited

U.S. PATENT DOCUMENTS

| | | | |
|---|---|---|---|
| 2014/0254812 A1* | 9/2014 | Quan | ..................... H04R 29/00 381/58 |
| 2015/0023511 A1* | 1/2015 | Quan | .................. H04R 29/004 381/58 |
| 2015/0229352 A1* | 8/2015 | Abdelmonem | ... H04W 72/0446 375/148 |
| 2020/0149942 A1* | 5/2020 | Rensing | .............. G01F 25/0007 |
| 2020/0166395 A1* | 5/2020 | Cunningham | ........ G01F 1/8436 |

* cited by examiner

FREQUENCY SPACINGS TO PREVENT INTERMODULATION DISTORTION SIGNAL INTERFERENCE

TECHNICAL FIELD

The embodiments described below relate to intermodulation distortion and, more particularly, to frequency spacings to prevent intermodulation distortion signal interference.

BACKGROUND

Vibrating meters, such as for example, Coriolis mass flowmeters, liquid density meters, gas density meters, liquid viscosity meters, gas/liquid specific gravity meters, gas/liquid relative density meters, and gas molecular weight meters, are generally known and are used for measuring characteristics of fluids. Generally, meters comprise a sensor assembly and an electronics portion. The material within the sensor assembly may be flowing or stationary. Each type of sensor may have unique characteristics, which a meter must account for in order to achieve optimum performance. For example, some sensors may require a tube apparatus to vibrate at particular displacement levels. Other sensor assembly types may require special compensation algorithms.

The meter electronics, among performing other functions, typically include stored sensor calibration values for the particular sensor being used. For example the meter electronics may include a reference sensor stiffness measurement. The reference sensor stiffness represents a fundamental measurement related to the sensor geometry for a specific sensor assembly, as measured in the factory under reference conditions. A change between a sensor stiffness measured after a vibrating element meter is installed at a customer site and a reference sensor stiffness may represent physical change in the sensor assembly due to coating, erosion, corrosion, or damage to conduits in the sensor assembly, in addition to other causes. A meter verification or health check test can detect these changes.

The meter verification is typically performed using a multi-tone drive signal, which may also be referred to as a multi-sine, multi-component, or the like, that is applied to a driver of the sensor assembly. A multi-tone drive signal is typically comprised of a resonant component, or drive tone, that is at the resonance frequency of a sensor assembly and a plurality of non-resonant components, or test tones, that are spaced apart from the drive tone with a frequency spacing. This is distinct from an approach where multiple test tones are cycled sequentially. In a sequential cycling of the test tones, any time-variance in the system (e.g. temperature-dependent effects, changes in flow) could corrupt the frequency response characterization of the sensor assembly. The multi-tone drive signal is advantageous because the sampled data is obtained simultaneously.

Each test tone in the multi-tone drive signal is an input to a frequency response of the sensor assembly. The components in the response signal provided by the sensor assembly are outputs of the frequency response function. These components are compared to the corresponding test tones to characterize a frequency response of the sensor assembly. If coating, erosion, corrosion, or damage occurs to the sensor assembly, the frequency response of the sensor assembly will change. However, non-linearities in the sensor assembly can form intermodulation distortion signals from the multi-tone drive signal.

The intermodulation distortion signals can cause the frequency response of the sensor assembly to vary without any underlying changes to the sensor assembly. More specifically, the drive and test tones in the multi-tone drive signal can induce intermodulation distortion signals with frequencies that may be at or about a frequency of one of the test tones. As a result, a component corresponding to an intermodulation distortion signal can interfere with the component corresponding to one of the test tones. This interference can cause the characterization of the frequency response to be inaccurate. Accordingly, there is a need to prevent intermodulation distortion signal interference.

SUMMARY

A system (800) for determining frequency spacings to prevent intermodulation distortion signal interference is provided. According to an embodiment, the system (800) comprises a sensor assembly (810) and a meter verification module (820) communicatively coupled to the sensor assembly (810). The meter verification module (820) is configured to determine a frequency of a first signal to be applied to the sensor assembly (810) of a vibratory meter and set a demodulation window about the frequency of the first signal. The meter verification module (820) is also configured to determine a frequency of the second signal to be applied to the sensor assembly such that a frequency of an intermodulation distortion signal generated by the first signal and the second signal is outside the demodulation window.

A method of determining frequency spacings to prevent intermodulation distortion signal interference is provided. According to an embodiment, the method comprises determining a frequency of a first signal to be applied to a sensor assembly of a vibratory meter, setting a demodulation window about the frequency of the first signal, and determining a frequency of the second signal to be applied to the sensor assembly such that a frequency of an intermodulation distortion signal generated by the first signal and the second signal is outside the demodulation window.

ASPECTS

According to an aspect, a system (800) for determining frequency spacings to prevent intermodulation distortion signal interference comprises a sensor assembly (810) and a meter verification module (820) communicatively coupled to the sensor assembly (810). The meter verification module (820) is configured to determine a frequency of a first signal to be applied to the sensor assembly (810) of a vibratory meter, set a demodulation window about the frequency of the first signal, and determine a frequency of the second signal to be applied to the sensor assembly such that a frequency of an intermodulation distortion signal generated by the first signal and the second signal is outside the demodulation window.

Preferably, the meter verification module (820) is further configured to determine a bandwidth that includes the frequency of the first signal and determine the frequency of the second signal such that the frequency of the second signal is within the bandwidth that includes the frequency of the first signal.

Preferably, the bandwidth is a frequency response bandwidth of the sensor assembly.

Preferably, the frequency of the first signal is a resonant frequency of the sensor assembly.

Preferably, the intermodulation distortion signal is generated in one of the meter verification module (820) and the sensor assembly (810).

Preferably, the first signal and the second signal are components of a drive signal that is applied by the meter verification module (820) to the sensor assembly (810).

Preferably, the second signal is applied to the sensor assembly (810) to characterize a frequency response of the sensor assembly (810).

Preferably, the meter verification module (820) being configured to determine the frequency of the second signal to be applied to the sensor assembly (810) such that a frequency of an intermodulation distortion signal generated by the first signal and the second signal is outside the demodulation window comprises the meter verification module (820) being configured to determine the frequency of the second signal such that the intermodulation distortion is proximate the demodulation window.

Preferably, the meter verification module (820) is further configured to determine a frequency of one or more additional signals such that frequencies of a plurality of intermodulation distortion signals generated by the one or more additional signals lie outside the demodulation window of the first signal.

Preferably, the meter verification module (820) is further configured to determine a bandwidth that includes the frequency of the first signal and determine the frequencies of the one or more additional signals such that the frequencies of the one or more additional signals are within the bandwidth that includes the frequency of the first signal.

Preferably, the meter verification module (820) is further configured to set demodulation windows about the one or more additional signals and determine the frequencies of the one or more additional signals such that the frequencies of a plurality of intermodulation distortion signals generated by the one or more additional signals lie outside the demodulation windows of the one or more additional signals.

According to an aspect, a method of determining frequency spacings to prevent intermodulation distortion signal interference comprises determining a frequency of a first signal to be applied to a sensor assembly of a vibratory meter, setting a demodulation window about the frequency of the first signal, and determining a frequency of the second signal to be applied to the sensor assembly such that a frequency of an intermodulation distortion signal generated by the first signal and the second signal is outside the demodulation window.

Preferably, the method further comprises determining a bandwidth that includes the frequency of the first signal and determining the frequency of the second signal such that the frequency of the second signal is within the bandwidth that includes the frequency of the first signal.

Preferably, the bandwidth is a frequency response bandwidth of the sensor assembly.

Preferably, the frequency of the first signal is a resonant frequency of the sensor assembly.

Preferably, the intermodulation distortion signal is generated in one of the meter electronics and the sensor assembly.

Preferably, the first signal and the second signal are components of a drive signal that is applied by the meter electronics to the sensor assembly.

Preferably, the second signal is applied to the sensor assembly to characterize the sensor assembly.

Preferably, determining the frequency of the second signal to be applied to the sensor assembly such that a frequency of an intermodulation distortion signal generated by the first signal and the second signal is outside the demodulation window comprises determining the frequency of the second signal comprised such that the intermodulation distortion is proximate the demodulation window.

Preferably, the method further comprises determining frequencies of one or more additional signals such that frequencies of a plurality of intermodulation distortion signals generated by the one or more additional signals lie outside the demodulation window of the first signal.

Preferably, the method further comprises determining a bandwidth that includes the frequency of the first signal, and determining the frequencies of the one or more additional signals such that the frequencies of the one or more additional signals are within the bandwidth that includes the frequency of the first signal.

Preferably, the method further comprises setting demodulation windows about the one or more additional signals and determining the frequencies of the one or more additional signals such that the frequencies of a plurality of intermodulation distortion signals generated by the one or more additional signals lie outside the demodulation windows of the one or more additional signals.

BRIEF DESCRIPTION OF THE DRAWINGS

The same reference number represents the same element on all drawings. It should be understood that the drawings are not necessarily to scale.

DETAILED DESCRIPTION

FIGS. 1-8 and the following description depict specific examples to teach those skilled in the art how to make and use the best mode of embodiments of frequency spacing to prevent intermodulation distortion signal interference. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of determining optimal frequency spacing to prevent intermodulation distortion signal interference. As a result, the embodiments described below are not limited to the specific examples described below, but only by the claims and their equivalents.

Interference by the intermodulation distortion signals can be prevented by determining a frequency of a first signal, such as a drive signal, to be applied to a sensor assembly in a vibratory meter and set a demodulation window about the frequency of the first signal. A frequency of the second signal which, when mixed with the first signal produces an intermodulation distortion signal, can be determined such that a frequency of the intermodulation distortion signal is outside the demodulation window. Accordingly, the intermodulation distortion signal is not included in a characterization of a frequency response of the sensor assembly. As a result, the characterization is more accurate and, therefore, corrosion, erosion, deposits, and other issues with the sensor assembly can be reliably detected.

Figure 1:
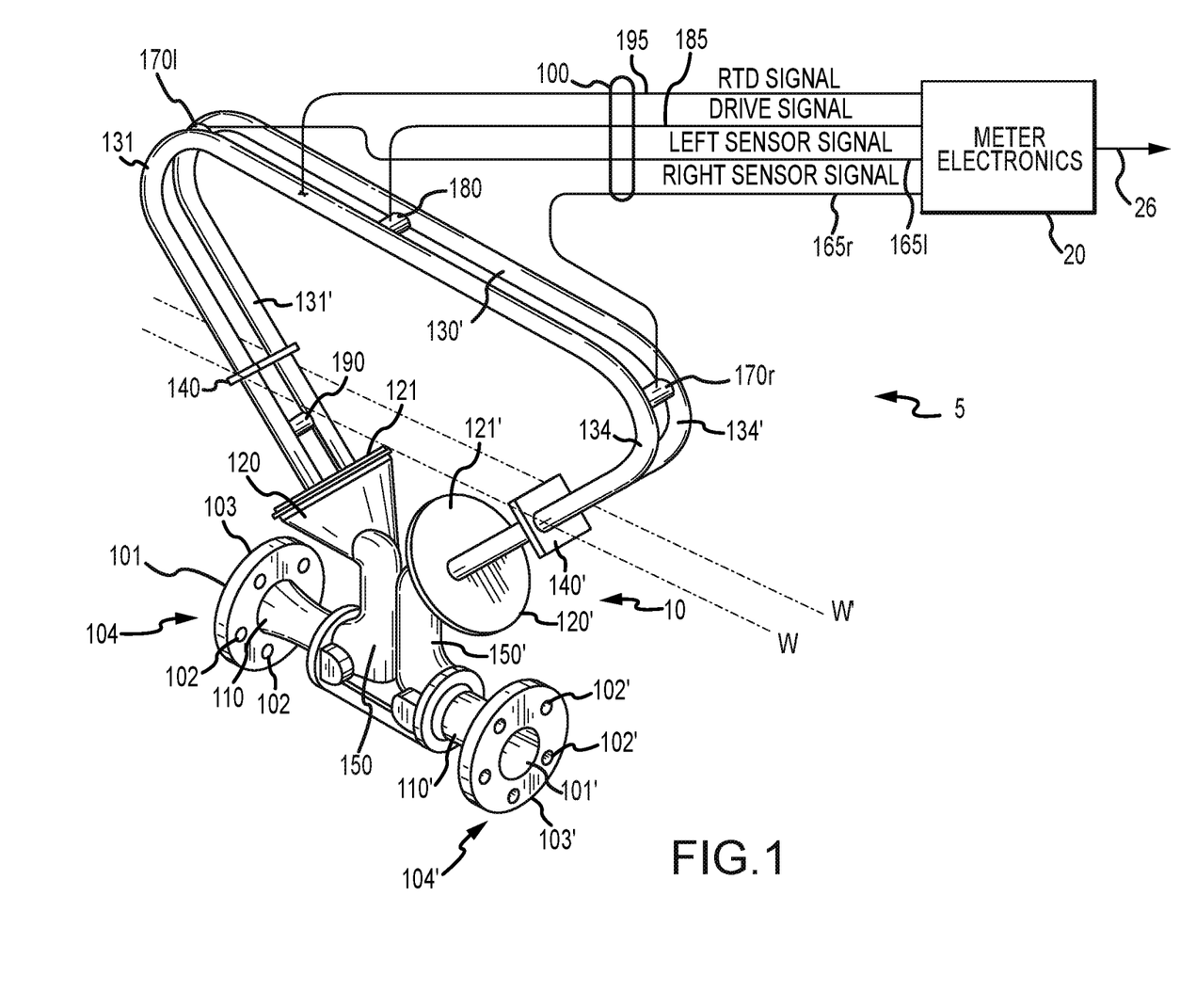
FIG. 1 shows a vibratory meter 5 using frequency spacings to prevent intermodulation distortion signal interference.

FIG. 1 shows a vibratory meter 5 using frequency spacings to prevent intermodulation distortion signal interference. As shown in FIG. 1, the vibratory meter 5 comprises a sensor assembly 10 and meter electronics 20. The sensor assembly 10 responds to mass flow rate and density of a process material. The meter electronics 20 is connected to the sensor assembly 10 via leads 100 to provide density, mass flow rate, and temperature information over path 26, as well as other information.

The sensor assembly 10 includes a pair of manifolds 150 and 150', flanges 103 and 103' having flange necks 110 and 110', a pair of parallel conduits 130 and 130', drive mechanism 180, resistive temperature detector (RTD) 190, and a pair of pick-off sensors 170l and 170r. Conduits 130 and 130' have two essentially straight inlet legs 131, 131' and outlet legs 134, 134', which converge towards each other at conduit mounting blocks 120 and 120'. The conduits 130, 130' bend at two symmetrical locations along their length and are essentially parallel throughout their length. Brace bars 140 and 140' serve to define the axis W and W' about which each conduit 130, 130' oscillates. The legs 131, 131' and 134, 134' of the conduits 130, 130' are fixedly attached to conduit mounting blocks 120 and 120' and these blocks, in turn, are fixedly attached to manifolds 150 and 150'. This provides a continuous closed material path through sensor assembly 10.

When flanges 103 and 103', having holes 102 and 102' are connected, via inlet end 104 and outlet end 104' into a process line (not shown) which carries the process material that is being measured, material enters inlet end 104 of the meter through an orifice 101 in the flange 103 and is conducted through the manifold 150 to the conduit mounting block 120 having a surface 121. Within the manifold 150 the material is divided and routed through the conduits 130, 130'. Upon exiting the conduits 130, 130', the process material is recombined in a single stream within the block 120' having a surface 121' and the manifold 150' and is thereafter routed to outlet end 104' connected by the flange 103' having holes 102' to the process line (not shown).

The conduits 130, 130' are selected and appropriately mounted to the conduit mounting blocks 120, 120' so as to have substantially the same mass distribution, moments of inertia and Young's modulus about bending axes W-W and W'-W', respectively. These bending axes go through the brace bars 140, 140'. Inasmuch as the Young's modulus of the conduits change with temperature, and this change affects the calculation of flow and density, RTD 190 is mounted to conduit 130' to continuously measure the temperature of the conduit 130'. The temperature of the conduit 130' and hence the voltage appearing across the RTD 190 for a given current passing therethrough is governed by the temperature of the material passing through the conduit 130'. The temperature dependent voltage appearing across the RTD 190 is used in a well-known method by the meter electronics 20 to compensate for the change in elastic modulus of the conduits 130, 130' due to any changes in conduit temperature. The RTD 190 is connected to the meter electronics 20 by lead 195.

Both of the conduits 130, 130' are driven by drive mechanism 180 in opposite directions about their respective bending axes W and W' and at what is termed the first out-of-phase bending mode of the flow meter. This drive mechanism 180 may comprise any one of many well-known arrangements, such as a magnet mounted to the conduit 130' and an opposing coil mounted to the conduit 130 and through which an alternating current is passed for vibrating both conduits 130, 130'. A suitable drive signal is applied by the meter electronics 20, via lead 185, to the drive mechanism 180.

The meter electronics 20 receives the RTD temperature signal on lead 195, and the left and right sensor signals appearing on leads 100 carrying the left and right sensor signals 165l, 165r, respectively. The meter electronics 20 produces the drive signal appearing on lead 185 to drive mechanism 180 and vibrate conduits 130, 130'. The meter electronics 20 processes the left and right sensor signals and the RTD signal to compute the mass flow rate and the density of the material passing through sensor assembly 10. This information, along with other information, is applied by meter electronics 20 over path 26 as a signal.

Figure 2:
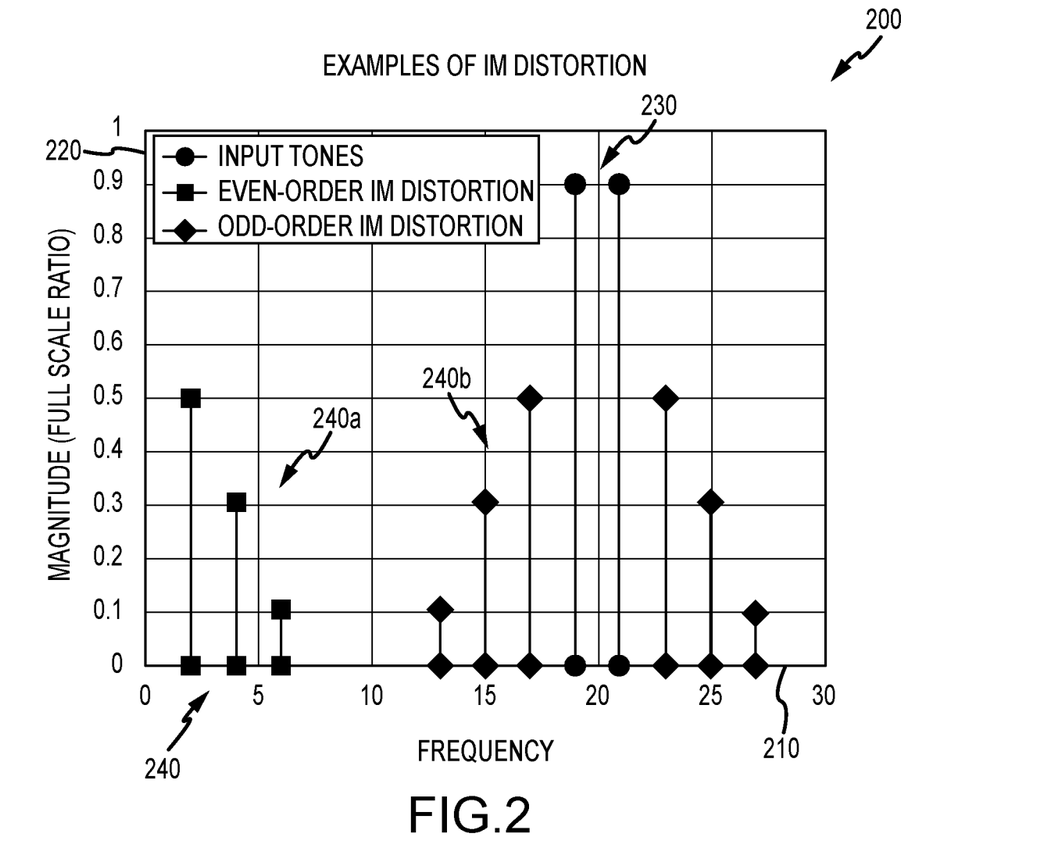
FIG. 2 shows a graph 200 illustrating intermodulation distortion signals in a multi-tone drive signal.

FIG. 2 shows a graph 200 illustrating intermodulation distortion signals in a multi-tone drive signal. As shown in FIG. 2, the graph 200 includes a frequency axis 210 and a magnitude axis 220. The frequency axis is in units of hertz (Hz) and ranges from 0 to 30. The magnitude axis 220 is a full scale ratio and ranges from 0 to 1. The graph 200 also includes two signals 230, which are symmetrically centered about 20 Hz. As shown in FIG. 2, the graph 200 includes intermodulation distortion signals 240, which are comprised of even-order intermodulation distortion signals 240a and odd-order intermodulation distortion signals 240b.

The two signals 230 are shown as being symmetrically centered about 20 Hz and have a magnitude of about 0.9. The two signals 230 may be provided to, for example, the sensor assembly 10 described above with reference to FIG. 1 using a multi-tone drive signal. More specifically, the multi-tone drive signal may be comprised of the two signals 230 that are provided to the drive mechanism 180.

The intermodulation distortion signals 240 may be in the sensor signals on the leads 100 and may be caused by the meter electronics 20 or the sensor assembly 10. For example, the intermodulation distortion signals 240 may be generated due to the multi-tone drive signal being close to or at a saturation of an amplifier in the meter electronics 20. The intermodulation distortion signals 240 may also be due to non-linearities in sensor assembly 10, such as the pickoff sensors 170l, 170r and the drive mechanism 180, or other devices or structures in the sensor assembly 10. The frequencies of the intermodulation distortion signals 240 are at multiples of a difference between the frequencies of the two signals 230. As can be appreciated, as more input signals are added, the number of intermodulation distortion signals increase, which can cause one or more of the intermodulation distortion signals to have the same frequencies of the input signals.

Figure 3:
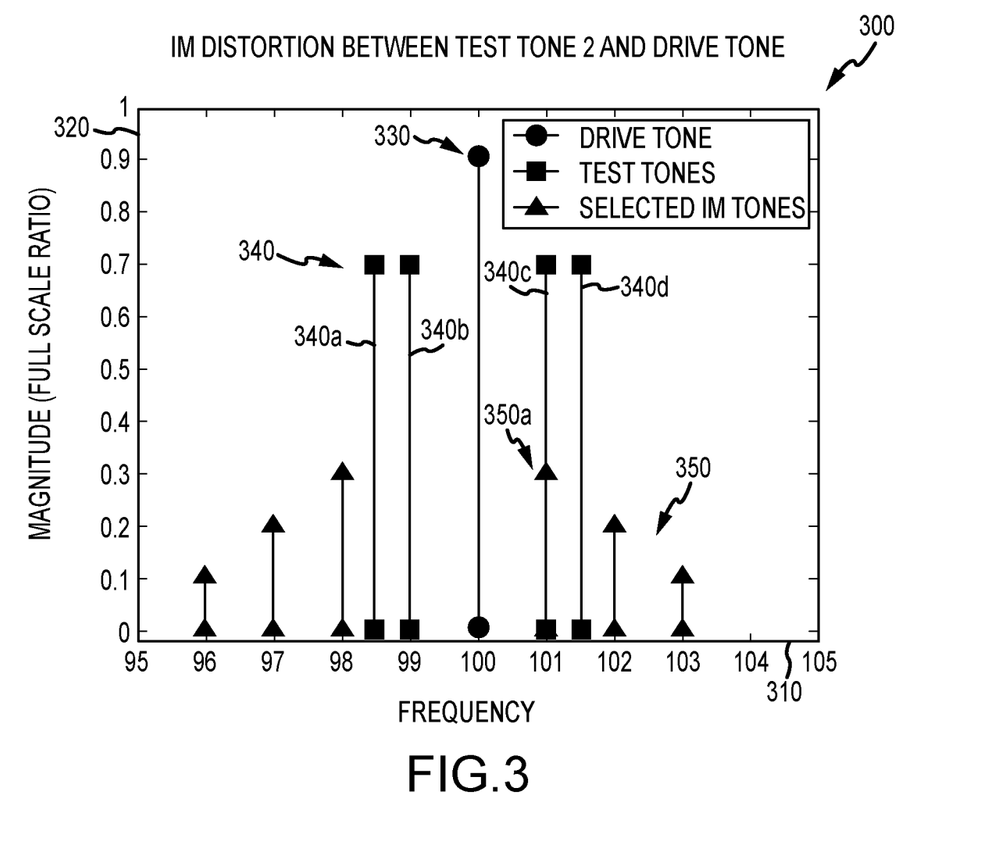
FIG. 3 shows a graph 300 illustrating intermodulation distortion.

FIG. 3 shows a graph 300 illustrating intermodulation distortion. As shown in FIG. 3, the graph 300 includes a frequency axis 310 and a magnitude axis 320. The frequency axis 310 is in units of hertz (Hz) and ranges from 95 to 105 Hz. The magnitude axis 320 is a full scale ratio and ranges from 0 to 1. The graph 300 includes a first signal 330, which is labeled as a 'drive tone' and may be a resonant component of a multi-tone drive signal. The first signal 330 has a frequency of 100 Hz.

Also shown are test tones 340, which may be non-resonant components (e.g., not at the resonant frequency of a sensor assembly) of the multi-tone drive signal. The test tones 340 are comprised of a second through fifth signal 340d. The graph 300 also includes intermodulation distortion signals 350. For clarity and discussion purposes, all of the possible intermodulation distortion signals are not shown. Instead, the intermodulation distortion signals 350 shown in FIG. 3 are generated from the first signal 330 and the third signal 340b. One of the intermodulation distortion signals 350 is an interfering signal 350a that has the same frequency as the fourth signal 340c. The test tones 340 may be injected into a drive signal, such as the drive signal appearing on lead 185 in the vibratory meter 5. Accordingly, the drive signal appearing on the lead 185 may be comprised of the first signal 330 and the second through fifth signals 340a-340d.

The magnitudes of the second through fifth signals 340a-340d may be measured and used to characterize the sensor assembly 10. For example, a magnitude ratio of an output corresponding to one of the second through fifth signals 340a-340d can characterize a response of the sensor assembly 10 at that frequency. By utilizing four test tones at different frequencies, a frequency response of the sensor assembly 10 over a range of frequencies can be approximated. However, since the interfering signal 350a, which is at the same frequency as the fourth signal 340c, is not one of the test tones 340 and is not measured as an input for a frequency response, the frequency response of the sensor assembly 10 is incorrect and, therefore, may not correctly detect erosion, corrosion, deposits, etc.

The frequency of the interfering signal 350a can be changed by changing the frequency spacing between the first signal 330 and the third signal 340b. More specifically, the frequency of the interfering signal 350a may be a multiple of a difference between the frequency of the first signal 330 and the third signal 340b. Accordingly, increasing or decreasing the frequency of the third signal 340b will increase or decrease the frequency of the interfering signal 350a. This will move the interfering signal 350a away from the fourth signal 340c, thereby preventing the interfering signal 350a from being included in characterizing the frequency response of the sensor assembly 10.

However, simply moving the interfering signal 350a away from the fourth signal 340c may not prevent the interfering signal 350a from being included in characterizing the frequency response of the sensor assembly 10. For example, even if the frequency of the interfering signal 350a is different than the frequency of the fourth signal 340c, the interfering signal 350a may still be within a demodulation window and, therefore, induce interfering components in the response signal from the sensor assembly.

Figure 4:
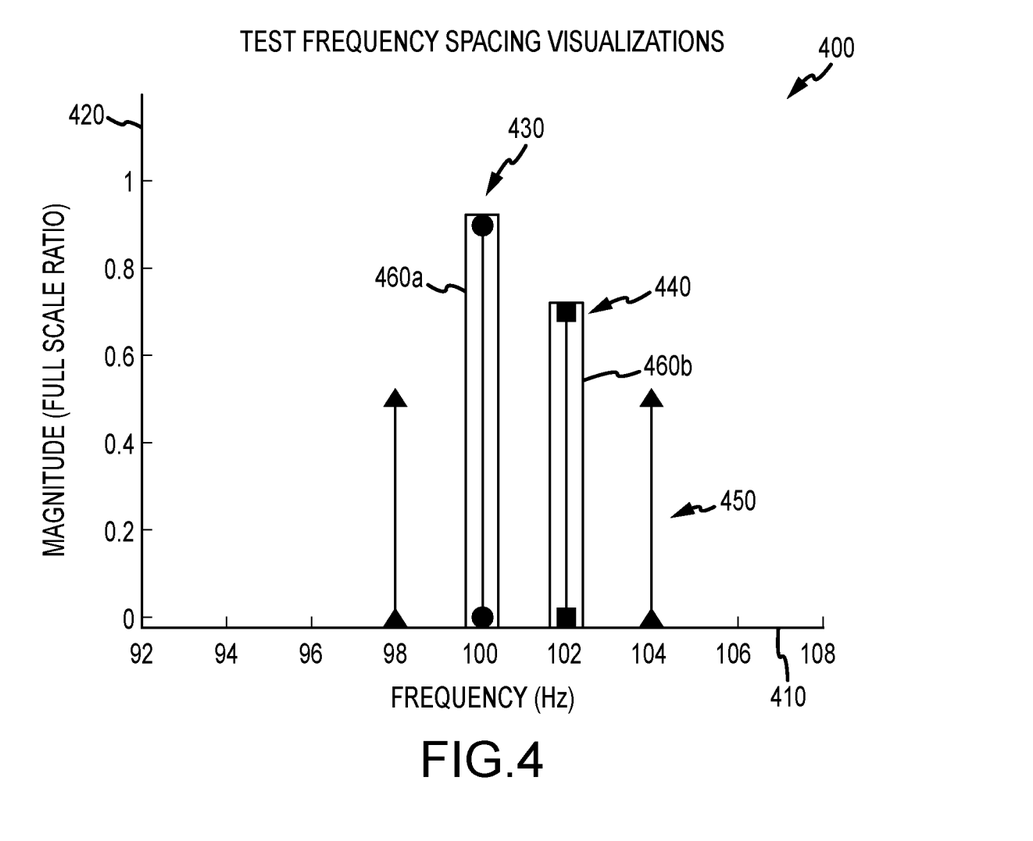
FIG. 4 shows a graph 400 illustrating frequency spacings to prevent intermodulation distortion signal interference.

FIG. 4 shows a graph 400 illustrating frequency spacings to prevent intermodulation distortion signal interference. As shown in FIG. 4, the graph 400 includes a frequency axis 410 and a magnitude axis 420. The frequency axis 410 is in units of hertz (Hz) and ranges from 92 to 108 Hz. The magnitude axis 420 is a full scale ratio and ranges from 0 to 1. The graph 400 includes a first signal 430, which may be a drive tone or resonant signal at the resonant frequency of a sensor assembly. Also shown is a second signal 440, which may be a test tone that is a non-resonant component of the multi-tone drive signal, and intermodulation distortion signals 450. Also shown in FIG. 4 is a first demodulation window 460a associated with the first signal 430 and a second demodulation window 460b associated with the second signal 440.

The first and second demodulation windows 460a, 460b may be frequency ranges about the frequencies of the first and second signals 430, 440 that allow the first and second signals 430, 440 to pass. For example, the first and second demodulation windows 460a, 460b may be about 1 Hz wide. Accordingly, the demodulation window for the first signal 430 may range from about 99.5 Hz to about 100.5 Hz. The demodulation window for the second signal 440 may range from about 101.5 Hz to about 102.5 Hz. The intermodulation distortion signals 450 are at frequencies of 98 and 104 Hz, which are not within the first and second demodulation window 460a, 460b. As a result, the intermodulation distortion signals 450 are not included in determining the frequency response of the sensor assembly 10. Additional signals, such as additional test tones, will result in additional intermodulation distortion signals that may not lie within demodulation windows if the frequency spacings are appropriately selected, as will be discussed below.

Figure 5:
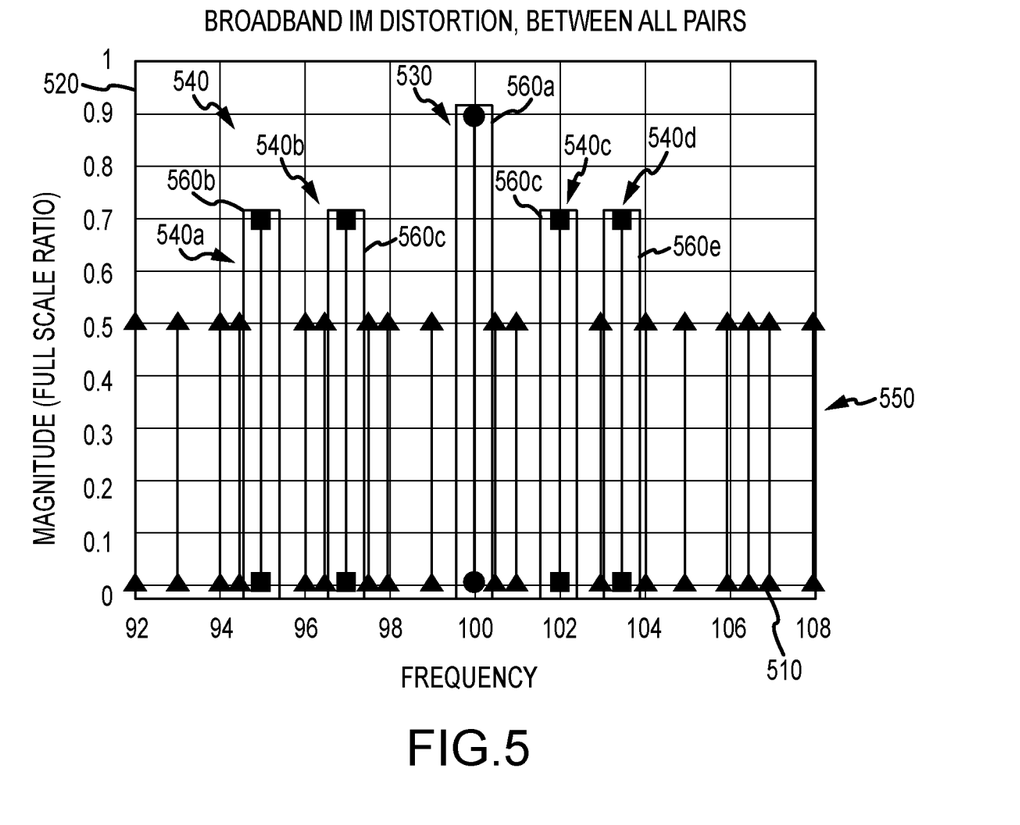
FIG. 5 shows a graph 500 illustrating frequency spacings to prevent intermodulation distortion signal interference.

FIG. 5 shows a graph 500 illustrating frequency spacings to prevent intermodulation distortion signal interference. As shown in FIG. 5, the graph 500 includes a frequency axis 510 and a magnitude axis 520. The frequency axis 510 is in units of hertz (Hz) and ranges from 92 to 108 Hz. The magnitude axis 520 is a full scale ratio and ranges from 0 to 1. The graph 500 includes a first signal 530, which may be a drive tone or signal at a resonant frequency of a sensor assembly. Also shown are test tones 540, which is comprised of a second signal 540a, a third signal 540b, a fourth signal 540c, and a fifth signal 540d and may be non-resonant sinusoidal components of a multi-tone drive signal. The graph 500 also includes intermodulation distortion signals 550. Demodulation windows 560 associated with the first signal 530 and the test tones 540 are also shown. The demodulation windows 560 include a first through fifth demodulation window 560a-560e that are respectively associated with the first through fifth signal 530, 540a-540d.

The first signal 530 and the second through fifth signal 540a-540d may comprise a multi-tone drive signal on the lead 185. The first signal 530 may be at a resonant frequency of a sensor assembly, which is shown as being 100 Hz. The second, third, fourth, and fifth signals 540a-540d are shown to be respectively at 95, 97, 102, and 103.5 Hz. The second through fifth signals 540a-540d are offset from the first signal 530, and each other, with frequency spacings. The frequency spacings may be selected to ensure that the intermodulation distortion signals 550 are not within the first through fourth demodulation windows 560b-560e, as is shown in FIG. 5. More specifically, all of the frequencies of the intermodulation distortion signals 550 may be determined for various frequency spacings of the first signal 530 and the second through fifth signals 540a-540d. As can be appreciated, other frequency spacings may result in intermodulation distortion signals 550 that are also not within the demodulation windows 560.

In addition, the sensor assembly 10 may have a range of frequencies at which the sensor assembly 10 is lightly damped, which is herein referred to as a frequency response bandwidth of the sensor assembly 10. More specifically, the sensor assembly 10 may be very lightly damped about the drive tone frequency, where the response of the sensor assembly 10 rapidly decreases away from the drive tone frequency. If the frequency spacings are too large, the first signal 530 may be centered within the frequency response bandwidth and one or more of the test tones 540 may be outside the frequency response bandwidth. This can result in a sensor signal with components having signal-to-noise ratios inadequate to characterize the frequency response of the sensor assembly 10.

To avoid this signal-to-noise ratio issue, the frequencies of the test tones 540 may be close to the frequency of the first signal 530 such that they lie within the frequency response bandwidth of the sensor assembly 10. Accordingly, it may be desirable to minimize a frequency spacing between a lowest frequency and a highest frequency of the test tones 540, which, in the embodiment of FIG. 5, are the second signal 540a and the fifth signal 540d. An example of this minimization is discussed in the following with reference to FIG. 6.

Figure 6:
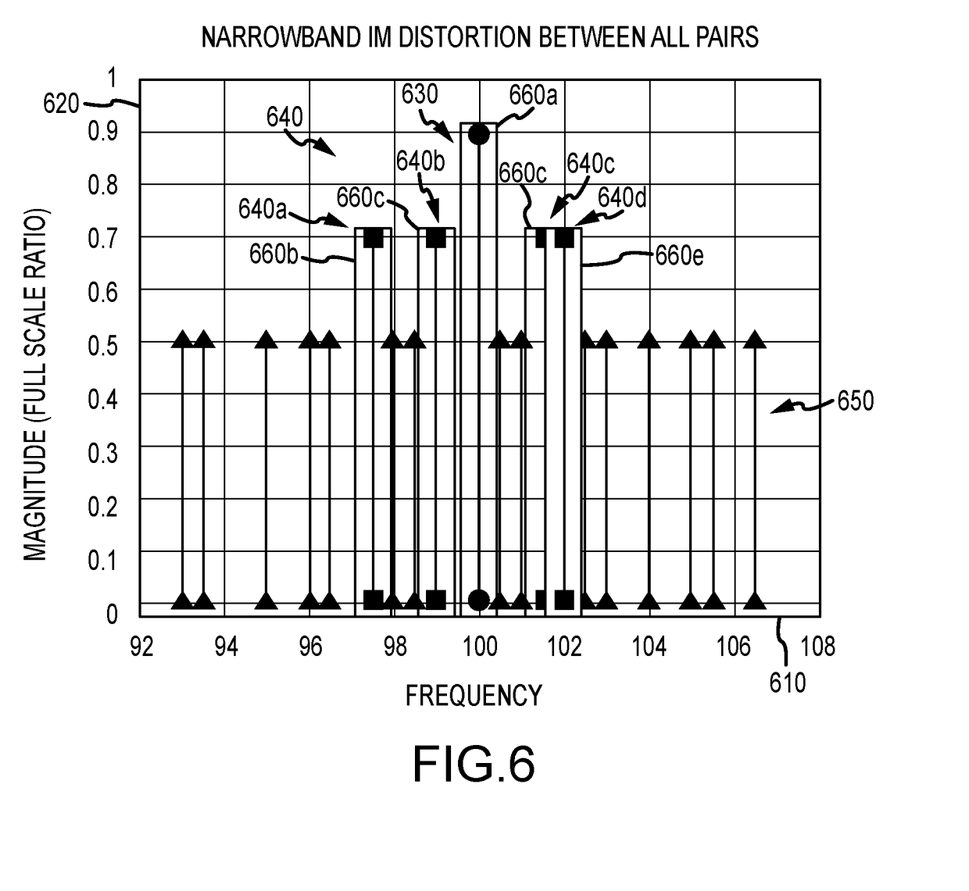
FIG. 6 shows a graph 600 illustrating frequency spacings to prevent intermodulation distortion signal interference.

FIG. 6 shows a graph 600 illustrating frequency spacings to prevent intermodulation distortion signal interference. As shown in FIG. 6, the graph 600 includes a frequency axis 610 and a magnitude axis 620. The frequency axis 610 is in units of hertz (Hz) and ranges from 92 to 108 Hz. The magnitude axis 620 is a full scale ratio and ranges from 0 to 1. The graph 600 includes a first signal 630, which may be a drive tone or signal at a resonant frequency of a sensor assembly. Also shown are test tones 640, which is comprised of a second signal 640a, a third signal 640b, a fourth signal 640c, and a fifth signal 640d. The test tones 640 may be sinusoidal components at non-resonant frequencies. The graph 600 also includes intermodulation distortion signals 650. Demodulation windows 660 associated with the first signal 630 and the test tones 640 are also shown. The demodulation windows 660 include a first through fifth demodulation window 660a-660e associated with the first signal 630 and the second signal 640a through fifth signal 640d.

As can be appreciated, the second and fifth signal 640a, 640d are closer together than the second and fifth signal 540a, 540d described above with reference to FIG. 5. The second and fifth signal 640a, 640d may be within the frequency response bandwidth of the sensor assembly. As a result, signals in the sensor signal corresponding to the test tones 640 may have acceptable signal-to-noise ratios. Additionally, some of the intermodulation distortion signals 650 are adjacent to the demodulation windows 660b-660e. More specifically, some of the intermodulation distortion signals 650 are outside, but next to, the demodulation windows 660b-660e. Therefore, the intermodulation distortion signals 650 are not passed by the demodulation windows 660b-660e, while allowing the components of the sensor signal corresponding to the test tones 640 to pass.

Accordingly, the characterization of the frequency response of the sensor assembly 10 can be more accurate by preventing the intermodulation distortion signals 650 from interfering with the signals corresponding to the test tones 640. The characterization of the frequency response may also be more accurate due to sufficient signal-to-noise ratios resulting from the closer frequency spacing between the second and fifth signal 640a, 640d. Exemplary methods and systems that can determine the frequency spacings are described in more detail in the following.

Figure 7:
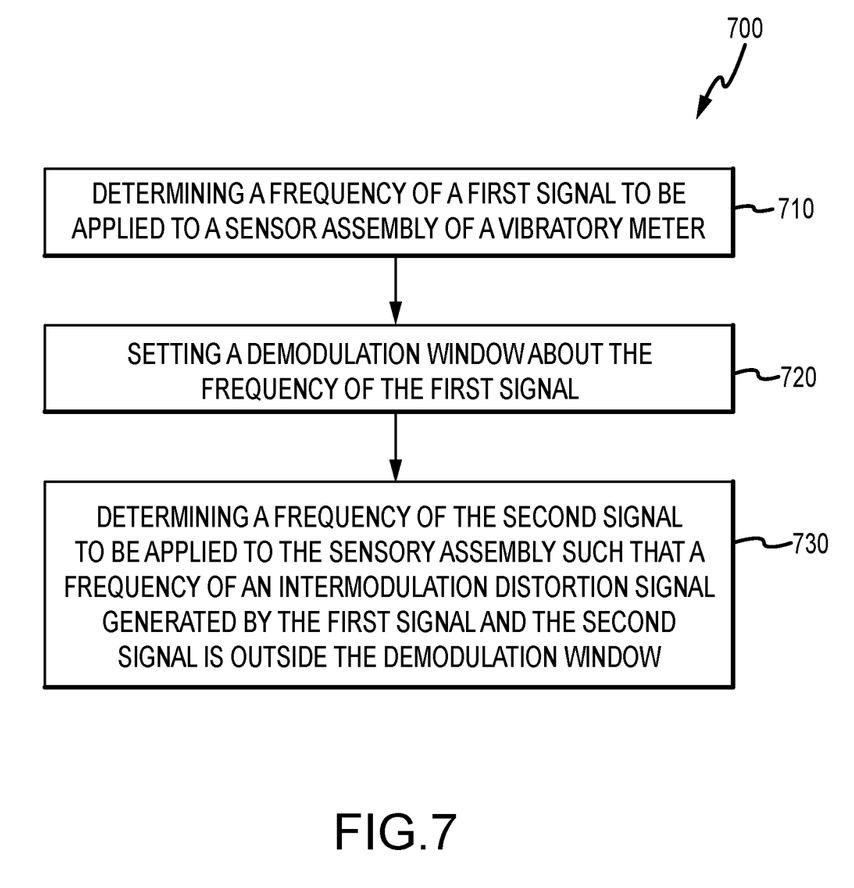
FIG. 7 shows a method 700 of determining frequency spacings to prevent intermodulation distortion signal interference according to an embodiment.

FIG. 7 shows a method 700 of determining frequency spacings to prevent intermodulation distortion signal interference according to an embodiment. As shown in FIG. 7, the method 700 determines a frequency of a first signal to be applied to a sensor assembly of a vibratory meter in step 710. In step 720, the method 700 sets a demodulation window about the frequency of the first signal. The method 700, in step 730, determines a frequency of a second signal to be applied to the sensor assembly such that a frequency of an intermodulation distortion signal generated by the first signal and the second signal is outside the demodulation window.

The frequency of the first signal may be determined in step 710 by, for example, generating a signal based on the left and right sensor signals appearing on the leads 100. That is, the first signal may be a drive tone of a multi-tone drive signal provided to the sensor assembly 10, which then provides the left and right sensor signals to a feedback loop which determines the frequency of the drive tone.

In step 720, the demodulation window can be set about the frequency of the first signal by, for example, determining upper and lower values associated with the frequency of the first signal. The upper value of the demodulation window can be set by adding a tolerance value to the frequency of the first signal and the lower value of the demodulation window can be set by subtracting the tolerance value from the frequency of the first signal. Accordingly, the demodulation is symmetric about the first frequency. Alternatively, the upper and lower values may not be symmetric about the first frequency and may therefore be offset from the first frequency by differing amounts.

In step 730, the frequency of the second signal can be determined by, for example, iteratively setting a second frequency to a value, determining a frequency of an intermodulation distortion signal, and determining if the intermodulation distortion signal is within the demodulation window. Other methods may be employed, such as, for example, determining a frequency of an intermodulation distortion signal based on a frequency of the upper or lower limit of the demodulation window and the frequency of the first signal.

In one example, a discrete solution space may be employed when determining the frequency of the second signal. The demodulation window of the first signal forces all test frequencies to be at least a demodulation window width dF from the frequency of the first signal (e.g., the drive tone frequency) and from any other test tone frequency. Since IM distortion signals appear based on the spacings between input frequencies, intermodulation distortion signals due to a particular input pair will also appear at least dF from those frequencies. Accordingly, the solution space is limited to test tones on a grid of resolution dF, centered on the frequency of the first signal. With this simplification, it becomes practical to pursue a brute-force optimization procedure. For example, the entire search space of four test tones all placed within a bandwidth of 20 dF, which may be the frequency response bandwidth of the sensor assembly, is an n-choose-k problem. From 2*20=40 potential frequencies (since the drive frequency cannot be used), four frequencies are to be selected. The number of ways to do this selection is evaluated as $$\frac{40!}{(40-4)!4!} = 91390.$$

The method 700 can be repeated for different frequencies of the first signal. For example, the step of determining a frequency of a first signal may include determining another frequency of the first signal. This can be a frequency that is within a range of frequencies associated with a class of vibratory meters. The frequency of a second signal that is associated with this carrier frequency can be determined by modulating the second signal with the first signal at the carrier frequency. The demodulation window set at the baseband frequency may or may not be the same as the demodulation window at the carrier frequency. This process is illustrated in the following discussion.

One can, for example, obtain a base test tone vector comprised of a second through fifth signal at base test tone frequencies of [−6−4 5 7]. This vector of base test tone frequencies can be modulated to other carrier frequencies, which may have different demodulation widow widths, defined as dF. In this example, the method 700 can determine a first frequency to be within a range of 70 to 125 Hz, such as 100 Hz. The method 700 can determine in step 720 that the width of the demodulation window (dF) is 0.267 Hz. The method 700 may determine the frequency of the second signal to be 100 Hz minus 1.6 Hz. Since the width of the demodulation window width is 0.267 Hz, the frequency of the second tone is determined by multiplying that element in the base tone vector by dF, in this case −6*0.267 Hz, which equals −1.6 Hz. Similar steps can be performed for additional signals, such as additional test tones.

For example, in a frequency range of 351 Hz to 600 Hz may be a first signal frequency or carrier frequency of 389.1 Hz, which can be determined from sensor signals from a meter assembly. The frequency range of 351 Hz to 600 Hz may have a demodulation window having a width of 1.3333 Hz. Accordingly, the base test tone vector can be multiplied by 1.3333 Hz to arrive at a test tone vector of [−8.000 −5.333 6.667 9.333] Hz. For the carrier frequency of 389.1 Hz for the first signal, the second signal will have a frequency of 381.1 Hz, which is equal to 389.1 Hz−8.0 Hz.

As discussed above, the method 700 can verify that the intermodulation distortion signals are outside the demodulation window of the first signal in step 730. This step can be performed for different carrier frequencies to ensure that the base tone vector works for all of the desired carrier frequencies. For example, as discussed above, the base test tone vector may be determined for the second through fifth signals and their associated frequencies in the range of 70 to 125 Hz and then verified at other carrier frequencies by using the base test tone vector of the second through fifth signals modulated to the different carrier frequencies as described above.

A resulting table may be as follows:

| Operating frequency (Hz) | | | Tone vector | | | | |
|---|---|---|---|---|---|---|---|
| Min | Max | dF | T1 ($2^{nd}$ sig.) | T2 | Td ($1^{st}$ sig.) | T4 | T5 |
| 70 | 125 | 0.2667 | −1.6000 | −1.067 | 0 | 1.333 | 1.867 |
| 126 | 180 | 0.3333 | −2.0000 | −1.333 | 0 | 1.667 | 2.333 |
| 181 | 225 | 0.4444 | −2.6667 | −1.778 | 0 | 2.222 | 3.111 |
| 226 | 350 | 0.6666 | −4.0000 | −2.667 | 0 | 3.333 | 4.667 |
| 351 | 600 | 1.3333 | −8.0000 | −5.333 | 0 | 6.667 | 9.333 |

Accordingly, for the above discussed example of a carrier, or drive tone, frequency of 389.10 Hz, the second signal may be at 381.10 Hz, a third signal at 383.77 Hz, a fourth signal at 395.77 Hz, and a fifth signal at 398.43 Hz.

The method 700 may additionally comprise determining a bandwidth that includes the frequency of the first signal and determining the frequency of the second signal such that the frequency of the second signal is within the bandwidth that includes the frequency of the first signal. The bandwidth may be the frequency response bandwidth of the sensor assembly to which the first and second signal is applied. For example, the sensor assembly 10 described above may have a relatively narrow range of frequencies in which the response is substantially resonant or lightly damped. The second, third or fourth signals may need to be within this bandwidth to adequately perform meter verification.

Figure 8:
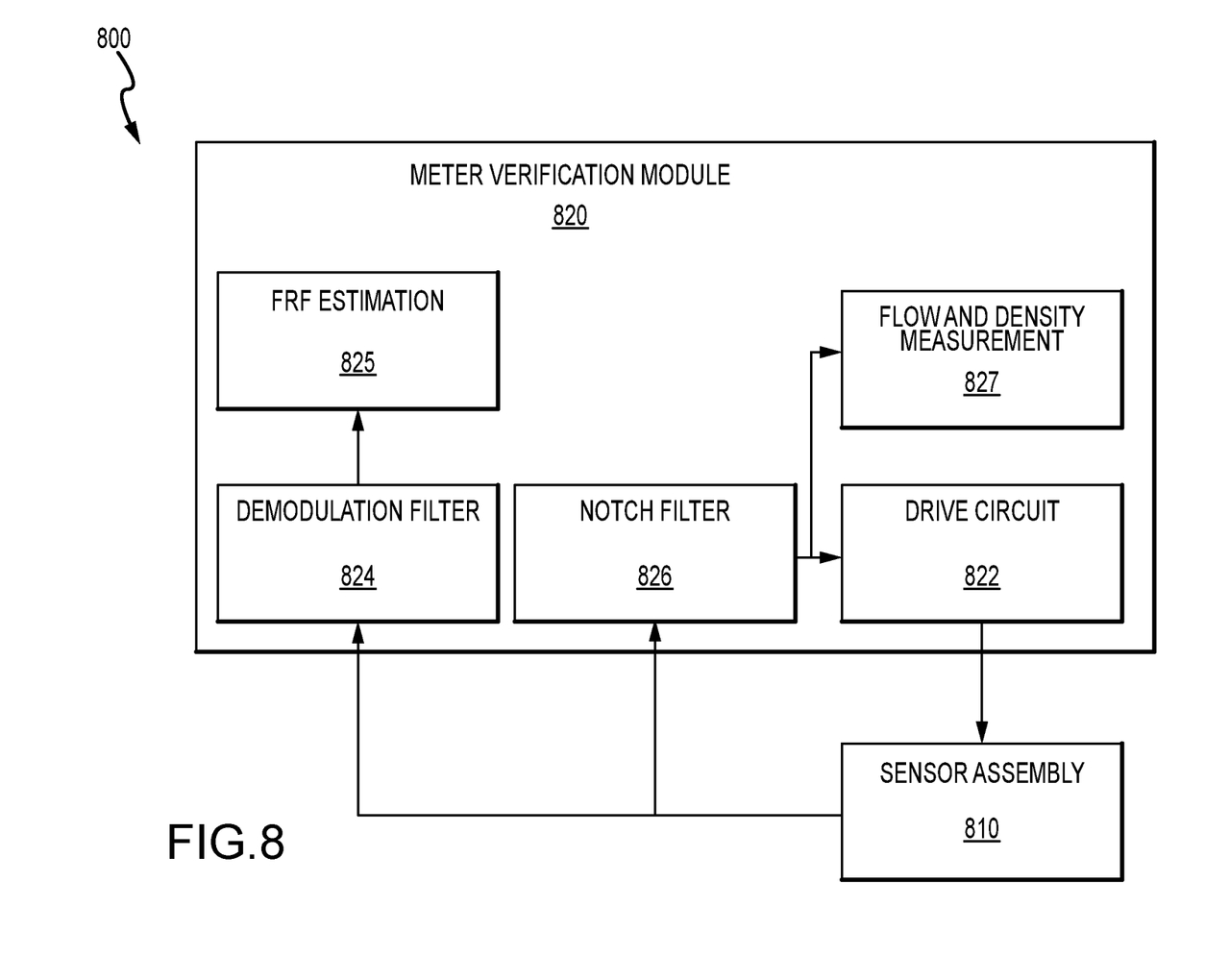
FIG. 8 shows a system 800 that is comprised of a sensor assembly 810 and a meter verification module 820.

FIG. 8 shows a system 800 that is comprised of a sensor assembly 810 and a meter verification module 820. As shown in FIG. 8, the sensor assembly 810 is communicatively coupled to the meter verification module 820. The meter verification module 820 includes a drive circuit 822 that provides a drive signal to the sensor assembly 810. The sensor assembly 810 is communicatively coupled with and provides sensor signals to the meter verification module 820. A demodulation filter 824 receives the sensor signals from the sensor assembly 810 and passes signals that are within a demodulation window or windows of the demodulation filter 824. The signals passed by the demodulation filter 824 are provided to an FRF estimation unit 825. A notch filter 826 also receives the sensor signal, which passes a resonant component to the drive circuit 822 and a flow and density measurement module 827, which can determine a fluid property of a fluid.

The sensor assembly 810 may be a model representing the sensor assembly 10 described in the foregoing with reference to FIG. 1. Alternatively, the sensor assembly 810 may be an actual sensor assembly that receives an electrical drive signal from the drive circuit 822. In either case, the sensor assembly 810 receives the multi-tone drive signal from the meter verification module 820 and provides the sensor signal to the meter verification module 820 to characterize the sensor assembly 810. The multi-tone drive signal is therefore an input to a frequency response of the sensor assembly 810 and the sensor signal is an output of the frequency response of the sensor assembly 810. By comparing the input and the output, the frequency response of the sensor assembly 810 may be characterized. Further, an analytical solution may be formulated by, for example, fitting a curve to the characterization of the sensor assembly 810.

The drive circuit 822 may be comprised of a feedback circuit that tracks the frequency of the resonant component and adjusts the frequency of the drive tone of the drive signal provided to the sensor assembly 810. The drive circuit 822 may also include a signal generator, amplifier, or the like that generates or provides the drive signal, which can be a multi-tone drive signal comprising the drive tone and test tones. As discussed above, if a crest in the multi-tone drive signal exceeds the drive amplifier's power capacity, intermodulation distortion signals may be generated.

The demodulation filter 824 passes signals that are within the demodulation windows. For example, with reference to FIG. 6, the demodulation filter 824 passes signals that are within the demodulation windows 660b-660e. Still referring to FIG. 6, the intermodulation distortion signals 650 are not within the demodulation windows 660b-660e and are therefore not passed by the demodulation filter 824. As a result, the meter verification module 820 can accurately verify the sensor assembly 810 with the second through fifth signals 640a-640d.

Since the intermodulation distortion signals 650 may only be present when the test tones 640 are employed during meter verification, the demodulation filter 824 and the notch filter 826 may not be employed during production operation of the vibratory meter 5. More specifically, during operation, the vibratory meter 5 may only provide a single component signal comprised of a sinusoidal signal having a frequency at the resonant frequency of the sensor assembly 810.

During meter verification, which utilizes the demodulation filter 824 determined with the method 700, the test tones 640 shown in FIG. 6 may be injected by the drive circuit 822 into the drive signal. That is, the meter verification module 820 may be used in the meter electronics 20 to verify the sensor assembly 10 shown in FIG. 1. Accordingly, during meter verification, the meter verification module 820 provides a multi-tone drive signal to the sensor assembly 10. Additionally, the meter verification module 820 may filter the sensor signals provided by the sensor assembly 10 with the demodulation filter 824 and the notch filters 826.

The new and useful vibratory meter 5, method 700, and system 800, as well as other embodiments, can prevent intermodulation distortion signal interference during meter verification. More specifically, the vibratory meter 5, method 700, and system 800 can be employed to ensure that intermodulation distortion signals 650 do not corrupt or affect the test tones 640 which are passed by the demodulation filter 824. Accordingly, the meter verification of the vibratory meter 5 is specifically improved by, for example, determining a frequency of the first signal 630 to be applied to the sensor assembly 810, setting the demodulation window 660a about the frequency of the first signal 630, and determining a frequency of the second signal 640a to be applied to the sensor assembly 810 such that a frequency of an intermodulation distortion signal 650 generated by the first signal 630 and the second signal 640a are outside the demodulation windows 660b-660e.

As a result, the meter verification can correctly determine if erosion, corrosion, or other conditions are present in the sensor assembly 10. For example, the frequency of the test tone 640 of a multi-tone drive signal may vary within the demodulation window 660a due to temperature variations, which changes frequencies of intermodulation distortion signals 650. By setting the demodulation windows 660b-660d and the frequencies of the test tones 640 such that the intermodulation distortion signals are never in the demodulation windows 660b-660e as the test tone 640 varies due to temperature, the frequency response of the sensor assembly 10 may be accurately characterized.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other frequency spacings to prevent intermodulation distortion signal interference and not just to the embodiments described above and shown in the accompanying figures. Accordingly, the scope of the embodiments described above should be determined from the following claims.

We claim:
1. A system (800) for determining frequency spacings to prevent intermodulation distortion signal interference, the system (800) comprising:
a sensor assembly (810); and
a meter verification module (820) communicatively coupled to the sensor assembly (810), the meter verification module (820) being configured to:
determine a frequency of a first signal to be applied to the sensor assembly (810) of a vibratory meter;
set a demodulation window about the frequency of the first signal; and
determine a frequency of the second signal to be applied to the sensor assembly such that a frequency of an intermodulation distortion signal generated by the first signal and the second signal is outside the demodulation window.

2. The system (800) of claim 1, wherein the meter verification module (820) is further configured to:
determine a bandwidth that includes the frequency of the first signal; and
determine the frequency of the second signal such that the frequency of the second signal is within the bandwidth that includes the frequency of the first signal.

3. The system (800) of claim 2, wherein the bandwidth is a frequency response bandwidth of the sensor assembly.

4. The system (800) of claim 1, wherein the frequency of the first signal is a resonant frequency of the sensor assembly.

5. The system (800) of claim 1, wherein the intermodulation distortion signal is generated in one of the meter verification module (820) and the sensor assembly (810).

6. The system (800) of claim 1, wherein the first signal and the second signal are components of a drive signal that is applied by the meter verification module (820) to the sensor assembly (810).

7. The system (800) of claim 1, wherein the second signal is applied to the sensor assembly (810) to characterize a frequency response of the sensor assembly (810).

8. The system (800) of claim 1, wherein the meter verification module (820) being configured to determine the frequency of the second signal to be applied to the sensor assembly (810) such that a frequency of an intermodulation distortion signal generated by the first signal and the second signal is outside the demodulation window comprises the meter verification module (820) being configured to determine the frequency of the second signal such that the intermodulation distortion is proximate the demodulation window.

9. The system (800) of claim 1, wherein the meter verification module (820) is further configured to determine a frequency of one or more additional signals such that frequencies of a plurality of intermodulation distortion signals generated by the one or more additional signals lie outside the demodulation window of the first signal.

10. The system (800) of claim 9, wherein the meter verification module (820) is further configured to:
determine a bandwidth that includes the frequency of the first signal; and
determine the frequencies of the one or more additional signals such that the frequencies of the one or more additional signals are within the bandwidth that includes the frequency of the first signal.

11. The system (800) of claim 9, wherein the meter verification module (820) is further configured to set demodulation windows about the one or more additional signals and determine the frequencies of the one or more additional signals such that the frequencies of a plurality of intermodulation distortion signals generated by the one or more additional signals lie outside the demodulation windows of the one or more additional signals.

12. A method of determining frequency spacings to prevent intermodulation distortion signal interference, the method comprising:
   determining a frequency of a first signal to be applied to a sensor assembly of a vibratory meter;
   setting a demodulation window about the frequency of the first signal; and
   determining a frequency of the second signal to be applied to the sensor assembly such that a frequency of an intermodulation distortion signal generated by the first signal and the second signal is outside the demodulation window.

13. The method of claim 12, further comprising:
   determining a bandwidth that includes the frequency of the first signal; and
   determining the frequency of the second signal such that the frequency of the second signal is within the bandwidth that includes the frequency of the first signal.

14. The method of claim 13, wherein the bandwidth is a frequency response bandwidth of the sensor assembly.

15. The method of claim 12, wherein the frequency of the first signal is a resonant frequency of the sensor assembly.

16. The method of claim 12, wherein the intermodulation distortion signal is generated in one of the meter electronics and the sensor assembly.

17. The method of claim 12, wherein the first signal and the second signal are components of a drive signal that is applied by the meter electronics to the sensor assembly.

18. The method of claim 12, wherein the second signal is applied to the sensor assembly to characterize the sensor assembly.

19. The method of claim 12, wherein determining the frequency of the second signal to be applied to the sensor assembly such that a frequency of an intermodulation distortion signal generated by the first signal and the second signal is outside the demodulation window comprises determining the frequency of the second signal comprised such that the intermodulation distortion is proximate to the demodulation window.

20. The method of claim 12, further comprising determining frequencies of one or more additional signals such that frequencies of a plurality of intermodulation distortion signals generated by the one or more additional signals lie outside the demodulation window of the first signal.

21. The method of claim 20, further comprising:
   determining a bandwidth that includes the frequency of the first signal; and
   determining the frequencies of the one or more additional signals such that the frequencies of the one or more additional signals are within the bandwidth that includes the frequency of the first signal.

22. The method of claim 20, further comprising setting demodulation windows about the one or more additional signals and determining the frequencies of the one or more additional signals such that the frequencies of a plurality of intermodulation distortion signals generated by the one or more additional signals lie outside the demodulation windows of the one or more additional signals.

* * * * *